(12) United States Patent
Kim

(10) Patent No.: US 8,797,083 B2
(45) Date of Patent: Aug. 5, 2014

(54) METHODS OF OPERATING TIMERS TO INHIBIT TIMING ERROR ACCUMULATION

(75) Inventor: Seung Kyu Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 304 days.

(21) Appl. No.: 12/716,492

(22) Filed: Mar. 3, 2010

(65) Prior Publication Data

US 2010/0225371 A1 Sep. 9, 2010

(30) Foreign Application Priority Data

Mar. 3, 2009 (KR) .................. 10-2009-0018028

(51) Int. Cl.
| | |
|---|---|
| *H03K 3/00* | (2006.01) |
| *G06F 1/04* | (2006.01) |
| *G06F 11/00* | (2006.01) |

(52) U.S. Cl.
USPC ............. 327/299; 327/48; 327/171; 327/291; 327/292; 713/500; 713/501; 713/502; 713/503

(58) Field of Classification Search
USPC ........ 327/45, 48, 171, 291, 292, 299; 377/47, 377/48; 713/500–503
See application file for complete search history.

(56) References Cited

U.S. PATENT DOCUMENTS

| | | | | |
|---|---|---|---|---|
| 4,114,363 | A | * | 9/1978 | Imamura ..................... 368/201 |
| 5,481,507 | A | * | 1/1996 | Suzuki et al. ................ 368/200 |
| 5,526,515 | A | | 6/1996 | Ross et al. |
| 5,818,847 | A | | 10/1998 | Zak |
| 2010/0034190 | A1 | * | 2/2010 | Yun et al. ..................... 370/350 |
| 2011/0280109 | A1 | * | 11/2011 | Raymond ...................... 368/46 |

FOREIGN PATENT DOCUMENTS

| | | |
|---|---|---|
| KR | 100265793 B1 | 6/2000 |
| KR | 1020070016434 A | 2/2007 |

\* cited by examiner

*Primary Examiner* — Lincoln Donovan
*Assistant Examiner* — Colleen O Toole
(74) *Attorney, Agent, or Firm* — Myers Bigel Sibley & Sajovec, PA

(57) ABSTRACT

Methods of operating timers include generating a periodic timing signal having a first frequency that differs from a desired timer frequency (1 KHz) by a first amount. This periodic timing signal having the first frequency can be generated by dividing a frequency of an input clock signal (e.g., 32.768 KHz) by N, where N is a positive integer greater than one. A typical value of N may be 32. The methods also include techniques to inhibit timing error accumulation by switching a frequency of the periodic timing signal from the first frequency to a second frequency that differs from the desired timer frequency by a second amount. This periodic timing signal having the second frequency can be generated by dividing the frequency of the input clock signal by M, where M is a positive integer unequal to N (e.g., M−N equals ±1).

18 Claims, 6 Drawing Sheets

METHODS OF OPERATING TIMERS TO INHIBIT TIMING ERROR ACCUMULATION

REFERENCE TO PRIORITY APPLICATION

This application claims priority to Korean Patent Application No. 10-2009-0018028, filed Mar. 3, 2009, the contents of which are hereby incorporated herein in its entirety.

FIELD OF THE INVENTION

The invention relates to error compensation methods for timers and, more particularly, to methods of compensating tick generation errors in timers in which ticks are generated at predetermined cycles by using clock signals.

BACKGROUND

To use a tick generated by a timer as a system tick needed by an embedded operating system, an error generated in a new timer needs compensation. For example, in a timer generating a tick at a cycle of 1 msec by using a clock signal of 32768 Hz, the timer may generate a tick at a cycle of about 1.007 msec by counting a clock signal 33 times. Accordingly, an error of about 7 μsec is generated at a cycle of 1 msec and the error of a timer is accumulated as time passes. As a result, a difference between the system tick that the operation system recognizes and actual time is accumulated as well.

Thus, it is difficult to use the tick of a timer directly as a tick of the operating system. That is, only after the error generated by the timer is compensated, the tick of a timer may be used as a tick of the operating system. To compensate the error of the timer, a complicated algorithm is performed or sophisticated hardware is needed.

SUMMARY

Methods of operating timers according to embodiments of the invention include generating a periodic timing signal having a first frequency that differs from a desired timer frequency (1,000 Hz) by a first amount. This periodic timing signal having the first frequency can be generated by dividing a frequency of an input clock signal (e.g., 32.768 KHz) by N, where N is a positive integer greater than one. A typical value of N may be 32. These methods may also include techniques to inhibit timing error accumulation by switching a frequency of the periodic timing signal from the first frequency to a second frequency that differs from the desired timer frequency by a second amount. This periodic timing signal having the second frequency can be generated by dividing the frequency of the input clock signal by M, where M is a positive integer unequal to N (e.g., M−N equals±1).

According to embodiments of the invention, this switching of the frequency is performed in response to counting a first number of cycles (e.g., 29 cycles) of the periodic timing signal having the first frequency. These efforts to inhibit timing error may also include switching the frequency of the periodic timing signal from the second frequency back to the first frequency. This switch back of the frequency of the timing signal is performed by dividing the frequency of the input clock signal by N, in response to counting a second number of cycles (e.g., 96 cycles) of the periodic timing signal having the second frequency. This second number is unequal to the first number.

According to still further embodiments of the invention, the steps of switching the frequency of the periodic timing signal from the first frequency to the second frequency and then switching the frequency of the periodic timing signal from the second frequency to the first frequency are performed in an alternating back-and-forth sequence so that the frequency of the periodic timing signal is repeatedly switched between the first and second frequencies. Moreover, to inhibit error accumulation, a ratio of the first number of cycles to the second number of cycles is maintained at a level sufficient to maintain a zero average error between the frequency of the periodic timing signal and the desired timer frequency.

DETAILED DESCRIPTION OF THE EMBODIMENTS

Figure 1:
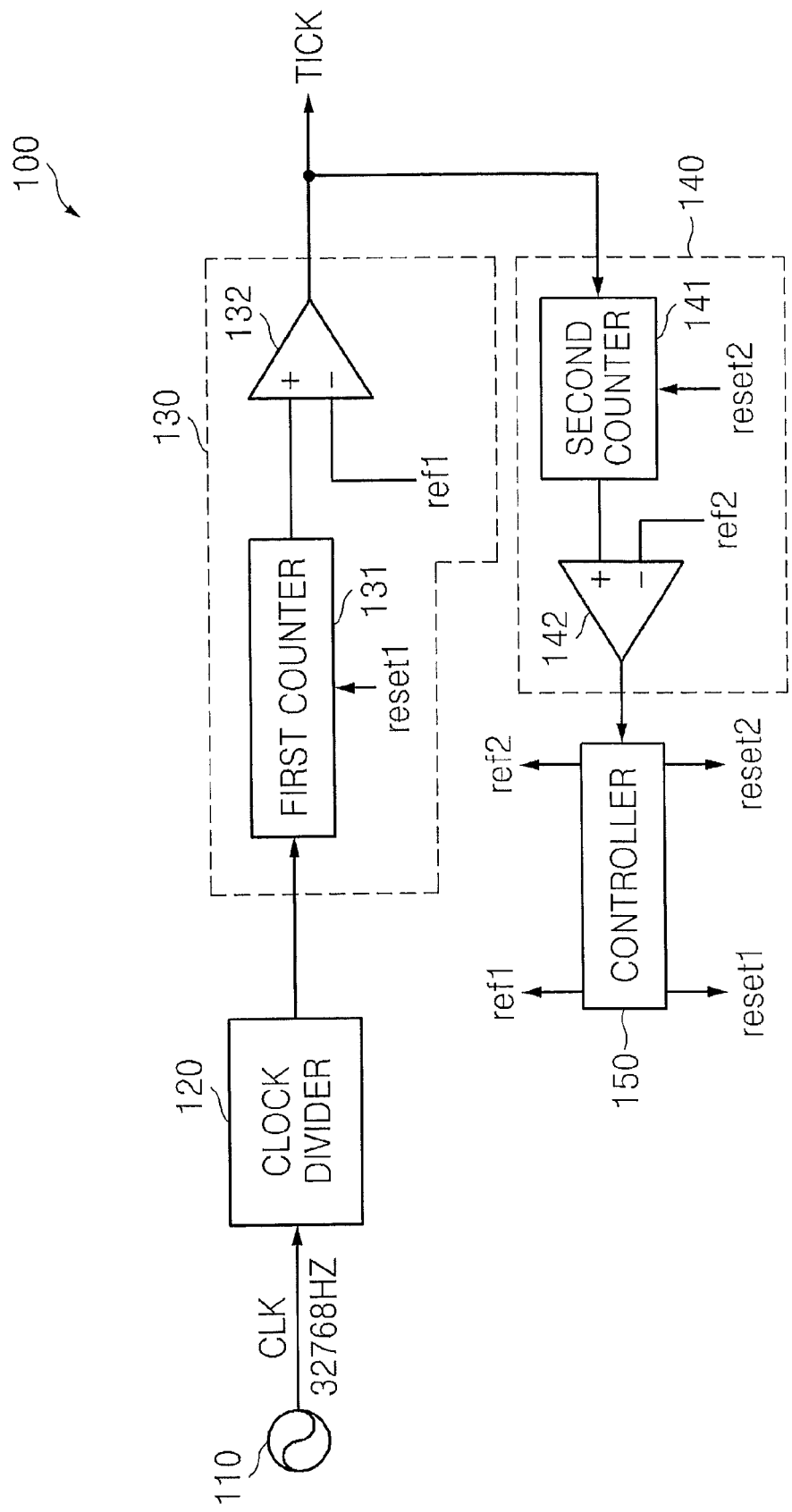
FIG. 1 is a block diagram of a timer according to an exemplary embodiment of the present inventive concept.

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a timer 100 according to an exemplary embodiment of the present inventive concept. Referring to FIG. 1, the timer 100 according to the present exemplary embodiment includes a clock divider 120, a first counting block 130, a second counting block 140, and a controller 150.

The clock divider 120 may receive a clock signal CLK from an oscillator 110 and control the resolution in tick generation of the timer 100 by dividing the received clock signal CLK. For example, when the frequency of the clock signal CLK received from the oscillator 110 is 32768 Hz and the dividing ratio of the clock divider 120 is set to the minimum, the frequency of a clock that would be a base for the tick generation may be 32768 Hz.

The timer 100 according to the present exemplary embodiment generates a tick at a target cycle of 1 msec by using the clock signal CLK having a frequency of 32769 Hz, which will be described in detail below.

The minimum resolution of the timer 100 based on the clock signal CLK of 32769 Hz is 1/32769 Hz=30.517578125 μsec. When a system tick of an operating system having the cycle of 1 msec is generated with such a resolution, an error is generated at a cycle of 1 msec. Table 1 shows the error in the tick generation cycle according to the counting number of the clock signal CLK.

TABLE 1

| Clock Signal Counting Number | Time Spent | 1 msec Reference Error | 1 msec Reference Absolute Error |
|---|---|---|---|
| 32 | 976.5625 μsec | −23.4375 μsec | 23.4375 μsec |
| 33 | 1007.080078125 μsec | 7.080075125 μsec | 7.080075125 μsec |

Referring to Table 1, it can be seen that a tick having a cycle of 1 msec cannot be accurately generated when the clock signal CLK of 32769 Hz is used. When the clock signal counting number is 32, a tick may be generated at a cycle of 976.5625 μsec, which is shorter than 1 msec. When clock signal counting number is 33, a tick may be generated at a cycle of 1007.080078125 μsec, which is longer than 1 msec.

When the timer 100 uses a fixed counting number of the clock signal CLK to generate a tick, the error of the timer 100 is gradually accumulated as time passes. However, when the frequency of ticks generated based on the counting of a clock signal CLK having a negative error with respect to 1 msec that is the target cycle and the frequency of ticks generated based on the counting of a clock signal CLK having a positive error with respect to 1 msec that is the target cycle are adjusted, the accumulated error of the timer 100 according to, the passage of time may be within a predetermined range.

In the method of compensation an error of the timer 100 according to the present exemplary embodiment, an operation to generate a tick is performed a given number of times that is obtained by dividing the least common multiple of a negative error and a positive error by the negative error, based on the counting number of the clock signal CLK generating the negative error, and an operation to generate a tick is performed a given number of times that is obtained by dividing the least common multiple of a negative error and a positive error by the positive error, based on the counting number of the clock signal CLK generating the positive error, thereby compensating the accumulated error of the time 100 at each cycle.

Table 2 shows the 1 msec reference absolute error values, the least common multiple thereof, the common multiple ratio of the absolute error values of the least common multiple when the clock signal counting number is 32 and 33.

TABLE 2

| Clock Signal Counting Number | 1 msec Reference Absolute Error | Least Common Multiple | Common Multiple Ratio |
|---|---|---|---|
| 32 | 23.4375 μsec | 679.6875 μsec | 29 |
| 33 | 7.080075125 μsec | 679.6875 μsec | 96 |

Referring to Table 2, it can be seen that the least common multiple of the absolute error with respect to 1 msec of the timer 100 when the clock signal counting number is 32 and 33 is 679.6875 μsec. The common multiple ratio of the least common multiple when the clock signal counting number is 32 is 29. The common multiple ratio of the least common multiple when the clock signal counting number is 33 is 96.

When the clock signal counting number is 32, the operation to generate a tick is performed 29 times and thus a negative error of 679.6875 μsec is generated. When the clock signal counting number is 33, the operation to generate a tick is performed 96 times and thus a positive error of 679.6875 μsec is generated. That is, by repeating the operation to generate a tick 29 times when clock signal counting number is 32 and 33 times when clock signal counting number is 33, the accumulated error is compensated at a cycle of 125 msec.

When the tick generated by the timer 100 is used as a system tick, the error between actual time and the system tick is 679.6875 μsec at its maximum with respect to 0 and does not exceed the maximum error range after time passes. Thus, the tick generated by the timer 100 according to the present exemplary embodiment may be used as a system tick of an operating system without performing an additional compensation algorithm or processing additional hardware.

The error compensation operation of the timer 100 may be performed by the first counting block 130 and the second counting block 140 of FIG. 1. The first counting block 130 may count the clock signal CLK i times to generate a tick at a first cycle that is shorter than the target cycle, or count the clock signal CLK j times to generate a tick at a second cycle that is longer than the target cycle. The number "i" or "j" is a natural number equal to or greater than 2.

Figure 2:
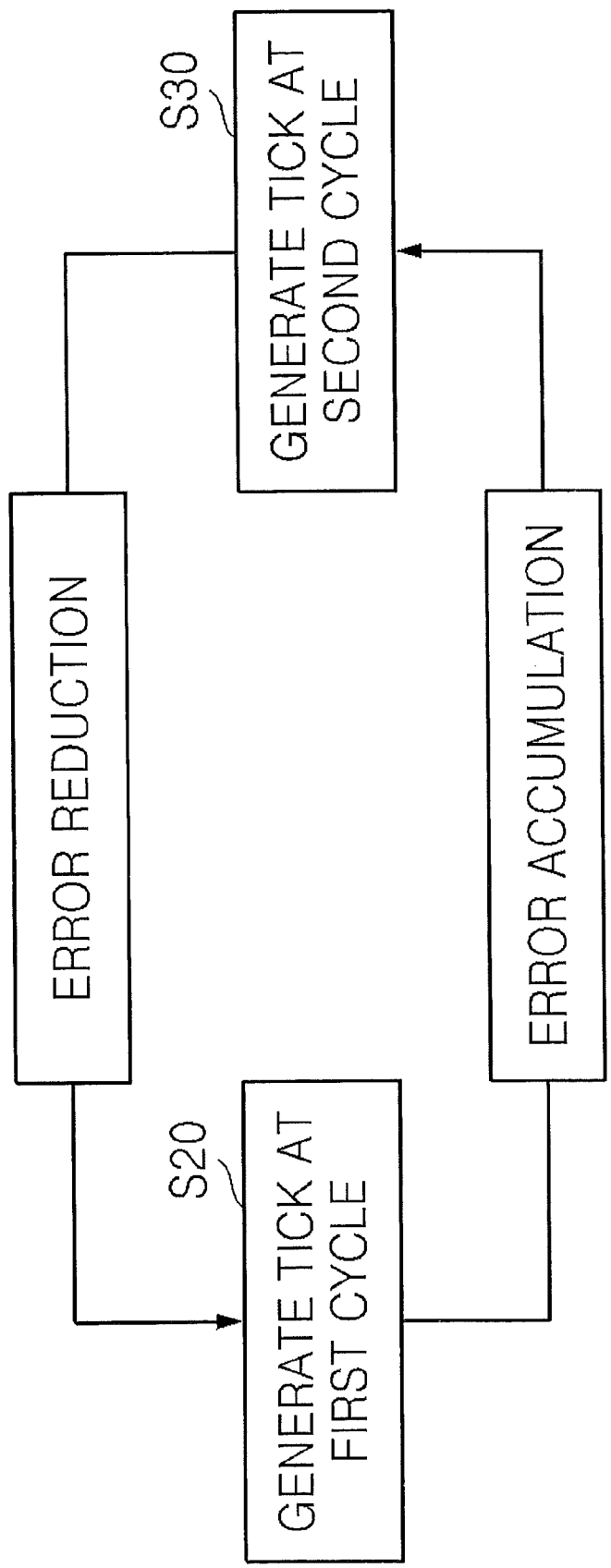
FIG. 2 is a flowchart for schematically explaining a method of compensating an error of a timer according to an exemplary embodiment of the present inventive concept.

FIG. 2 is a flowchart for schematically explaining a method of compensating an error of the timer 100 according to an exemplary embodiment of the present inventive concept. Referring to FIG. 2, it can be seen that the timer 100 may reduce the accumulated error by compensating for an error accumulated in an operation (S20) in which a tick is generated at the first cycle that is shorter than the target cycle with an error generated in an operation (S30) in which a tick is generated at the second cycle.

For example, the first counting block 130 counts the clock signal CLK of 32768 Hz 32 times to generate a tick at a cycle of 976.5625 μsec that is 23.4375 μsec shorter than the target cycle of 1 msec, or counts the clock signal CLK of 32768 Hz 33 times to generate a tick at a cycle of 1007.080078125 μsec that is 7.080075125 μsec longer than the target cycle of 1 msec. As a result, the clock signal counting number of the first counting block 130 may be controlled by the controller 150.

The first counting block 130 includes a first counter 131 and a tick generation unit 132. The first counter 131 counts the clock signal CLK and may be reset in response to a reset signal reset1 received from the controller 150. For example, the first counter 131 may be reset after counting the clock signal CLK of 32768 Hz 32 times or 33 times.

The tick generation unit 132 may generate a tick at the first cycle based on a result of comparison between the counting number of the first counter 131 and the reference value ref1 i, or at the second cycle based on a result of comparison between the counting number of the first counter 131 and the reference value ref1 j. The reference value ref1 of the tick generation unit 132 may be varied by the controller 150.

As illustrated in FIG. 1, the tick generation unit 132 may be implemented by a comparator that receives the counting number of the first counter 131 and the reference value ref1 and outputs a comparison result therebetween. For example, the tick generation unit 132 may generate a tick at a cycle of 976.5625 μsec when the counting number of the first counter 131 is 32 times, or a tick at a cycle of 1007.080078125 μsec when the counting number of the first counter 131 is 33 times. After generating a tick, the tick generation unit 132 may be reset in response to the reset signal reset1.

The second counting block 140 may count the tick generated at the first cycle m times, or the tick generated at the second cycle n times, and output a counting result with respect to the tick generated at the first cycle and the tick generated at the second cycle. The number "m" or "n" is a natural number that is equal to or greater than 2.

The second counting block 140 may include a second counter 141 and a comparator 142. The second counter 141 may count a tick generated at the first cycle or a tick generated at the second cycle which is output from the first counting block 130. The comparator 142 may output a result of comparison between each of the counting number of the ticks generated at the first cycle and the counting number of the ticks generated at the second cycle, and a reference value ref2. Then, the controller 150 may generate a plurality of signals ref1, ref2, reset1, and reset2 to control the operations of the first and second counting blocks 130 and 140 based on the result of counting ticks of the second counting block 140.

In detail, the controller 150 may control the reference value ref1 of the tick generation unit 132 and the reference value ref2 of the comparator 142 based on a result of the comparison between the counting number of the ticks generated at the first cycle and the reference value in. Also, the controller 150 may control the reference value ref1 of the tick generation unit 132 and the reference value ref2 of the comparator 142 based on a result of the comparison between the counting number of the ticks generated at the second cycle and the reference value n.

For example, when the second counting block 140 counts a tick generated at a cycle of 976.5625 μsec 29 times as the first counting block 130 counts the clock signal CLK 32 times, the controller 150 may control the reference value ref1 of the tick generation unit 132 to be 33 and the reference value ref2 of the comparator 142 to be 96. When the second counting block 140 counts a tick generated at a cycle of 1007.080078125 μsec 96 times as the first counting block 130 counts the clock signal CLK 33 times, the controller 150 may control the reference value ref1 of the tick generation unit 132 to be 32 and the reference value ref2 of the comparator 142 to be 29.

Also, the second counting block 140 may count a tick by dividing the reference value ref2 of the comparator 142 into a plurality of sub-units. The controller 150 may control the reference value ref1 of the tick generation unit 132 and the reference value ref2 of the comparator 142 based on a result of counting of a tick corresponding to each of the sub-units.

The controller 150 may control the reference value ref1 of the tick generation unit 132 and the reference value ref2 of the comparator 142 based on a result of comparison between the counting number of the ticks generated at the first cycle and a reference value obtained by dividing the reference value ref2 of the comparator 142 into a plurality of first sub-units, or control the reference value ref1 of the tick generation unit 132 and the reference value ref2 of the comparator 142 based on a result of comparison between the counting number of the ticks generated at the second cycle and a reference value obtained by dividing the reference value ref2 of the comparator 142 into a plurality of second sub-units.

The controller 150 may sequentially perform the operations of counting ticks generated at the first cycle of 976.5625 μsec 15 times of sub-units of 29, counting ticks generated at the second cycle of 1007.080078125 μsec 48 times of sub-units of 96, counting ticks generated at the first cycle of 976.5625 μsec 14 times of sub-units of 29, counting ticks generated at the second cycle of 1007.080078125 μsec 48 times of sub-units of 96. Whenever each tick counting operation is performed, the reference value ref1 of the tick generation unit 132 and the reference value ref2 of the comparator 142 may be controlled.

In the above-described example, each of the counting reference value of ticks generated at the first cycle and the counting reference value of ticks generated at the second cycle is counted by being divided into two sub-units. When the counting of each sub-unit is completed, the controller 150 controls the reference value ref1 of the tick generation unit 132 and the reference value ref2 of the comparator 142. However, the scope of the present inventive concept is not limited thereto.

For example, while the ticks generated at the first cycle are counted by dividing a first counting reference value into two sub-units, the ticks generated at the second cycle are counted as many as second counting reference value at once. Whenever each tick counting operation is completed, the controller 150 may control the reference value ref1 of the tick generation unit 132 and the reference value ref2 of the comparator 142.

Also, while the ticks generated at the second cycle are counted by dividing the second counting reference value into two sub-units, the ticks generated at the first cycle are counted as many as the first counting reference value at once. Whenever each tick counting operation is completed, the controller 150 may control the reference value ref1 of the tick generation unit 132 and the reference value ref2 of the comparator 142.

As described above, the tick counting number of the second counting block 140 may be determined based on the ratio of the least common multiple of the first absolute error value between the target cycle and the first cycle that is shorter than the target cycle and the second absolute error value between the target cycle and the second cycle that is longer than the target cycle. For example, the tick counting number "m" generated at the first cycle may be a value obtained by dividing the least common multiple of the first absolute value and the second absolute value by the first absolute error value, or the tick counting number "n" generated at the second cycle may be a value obtained by dividing the least common multiple of the first absolute value and the second absolute value by the second absolute error value.

Referring to Table 2, when the clock signal counting number for tick generation is 32 times, the first absolute error value between the target cycle of 1 msec and the first cycle of 976.5625 μsec is 23.4375 μsec. When the clock signal counting number for tick generation is 33 times, the second absolute error value between the target cycle of 1 msec and the second cycle of 1007.080078125 μsec is 7.080075125 μsec. The least common multiple between the first and second absolute error values is 679.6875 μsec.

Thus, the tick counting number of the second counting block 140 is 29 times that is obtained by dividing 679.6875 μsec by 23.4375 μsec when the clock signal counting number for tick generation is 32 times, or 96 times that is obtained by dividing 679.6875 μsec by 7.080075125 μsec when the clock signal counting number for tick generation is 33 times.

The controller 150 may reset the clock signal counting value of the tick generation unit 132 of the first counting block 130 or the clock signal counting value of the comparator 142 of the second counting block 140 based on the result of comparison between the counting result of the ticks generated at the first cycle and the reference value ref2 of the comparator 142 and the result of comparison between the counting result of the ticks generated at the second cycle and the reference value ref2 of the comparator 142.

Each of the constituent elements of the timer 100 according to the present exemplary embodiment may be implemented by software, hardware, or a combination of software and hardware to perform the technical concept of the present inventive concept. That is, each of the constituent elements of the timer 100 according to the present exemplary embodiment may be implemented by a logical combination of a predetermined code and hardware resource to perform the code.

Figure 3:
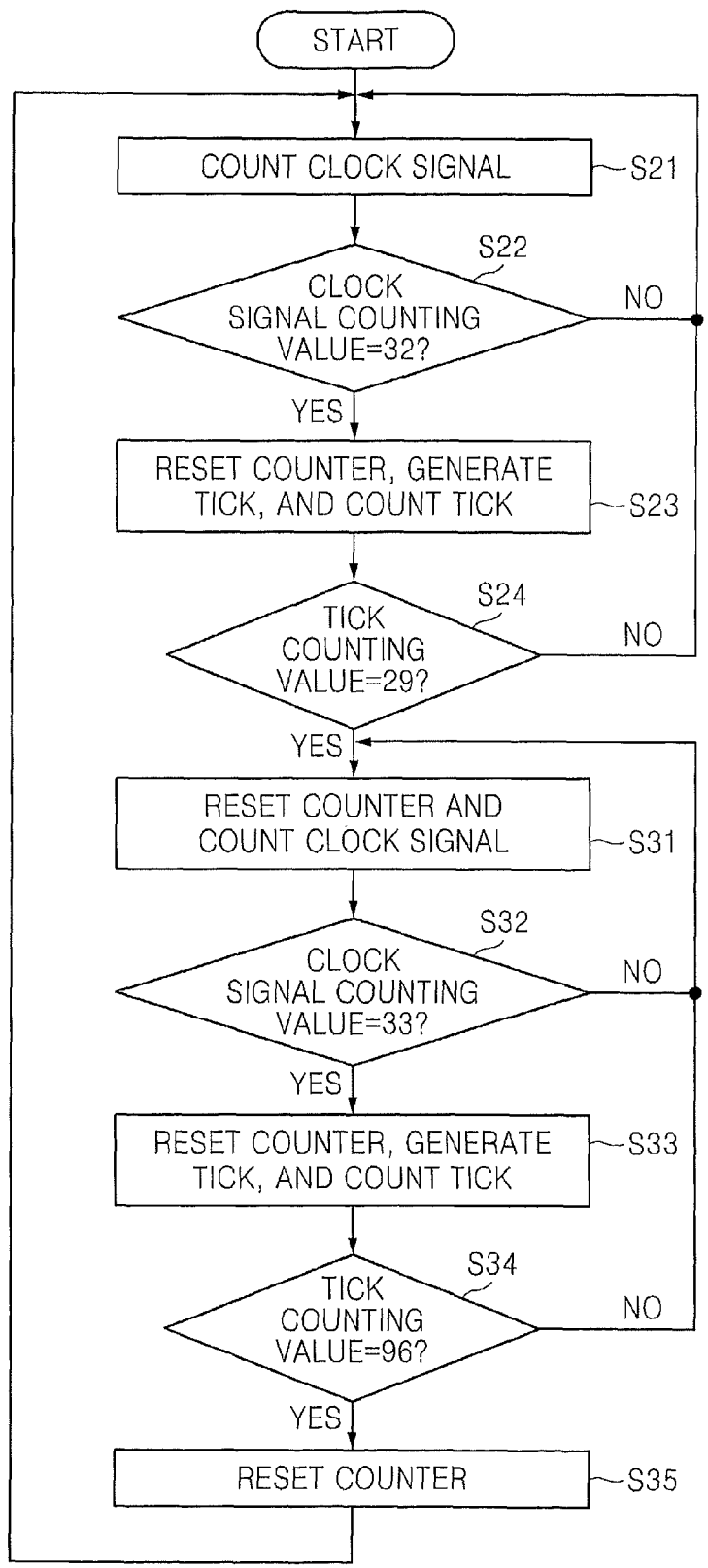
FIG. 3 is a flowchart for explaining, in detail, a method of compensating an error of a timer according to an exemplary embodiment of the present inventive concept.

FIG. 3 is a flowchart for explaining, in detail, a method of compensating an error of a timer according to an exemplary embodiment of the present inventive concept. According to the method of compensating an error of the timer 100 of FIG. 3, an error is compensated by counting 29 times the ticks generated by counting the clock signal CLK of 32768 Hz 32 times, and counting 96 times the ticks generated by counting the clock signal CLK 33 times. The process of the method is described below with reference to FIGS. 1 and 3.

The first counter 131 counts the clock signal CLK of 32768 Hz (S21). The tick generation unit 132 compares the reference value ref1 32 and the clock signal counting value to determine whether the clock signal counting value is 32 (S22). The operations S21 and S22 are repeatedly performed until the clock signal counting value is 32.

When the clock signal counting value is 32, the first counter 131 is reset in response to the reset signal reset1 received from the controller 150, the tick generation unit 132 generates a tick, and the second counter 141 counts the tick (S23).

The comparator 142 determines whether the tick counting value is 29 (S24). In this operation, it is determined whether the tick generated at a cycle of 976.5625 μsec is generated 29 times and thus a negative accumulated error of the timer 100 with respect to a target time of 29 msec reaches 679.6875 μsec. When the tick counting value is less than 29, the operations S21-S24 are repeatedly performed.

When the tick counting value is 29, the second counter 141 is reset in response to the reset signal reset2 received from the controller 150 and the first counter 131 counts the clock signal CLK (S31). The tick generation unit 132 compares the reference value ref1 33 and the clock signal counting value and determines whether the clock signal counting value is 33 (S32). The operation S31 and S32 are repeatedly performed until the clock signal counting value is 33.

When the clock signal counting value is 33, the first counter 131 is reset in response to the reset signal reset1 received from the controller 150, the tick generation unit 132 generates a tick, and the second counter 141 counts the tick (S33).

The comparator 142 determines whether the tick counting value is 96 (S34). In this operation, it is determined whether the tick generated at a cycle of 1007.080078125 μsec is generated 96 times and thus a positive accumulated error of the timer 100 with respect to the target time of 29 msec reaches 679.6875 μsec. When the tick counting value is less than 96, the operations S31-S34 are repeatedly performed. When the tick counting value is 96, the second counter 141 is reset in response to the reset signal reset2 received from the controller 150 and the operation S21 and S35 are repeatedly performed.

Figure 4:
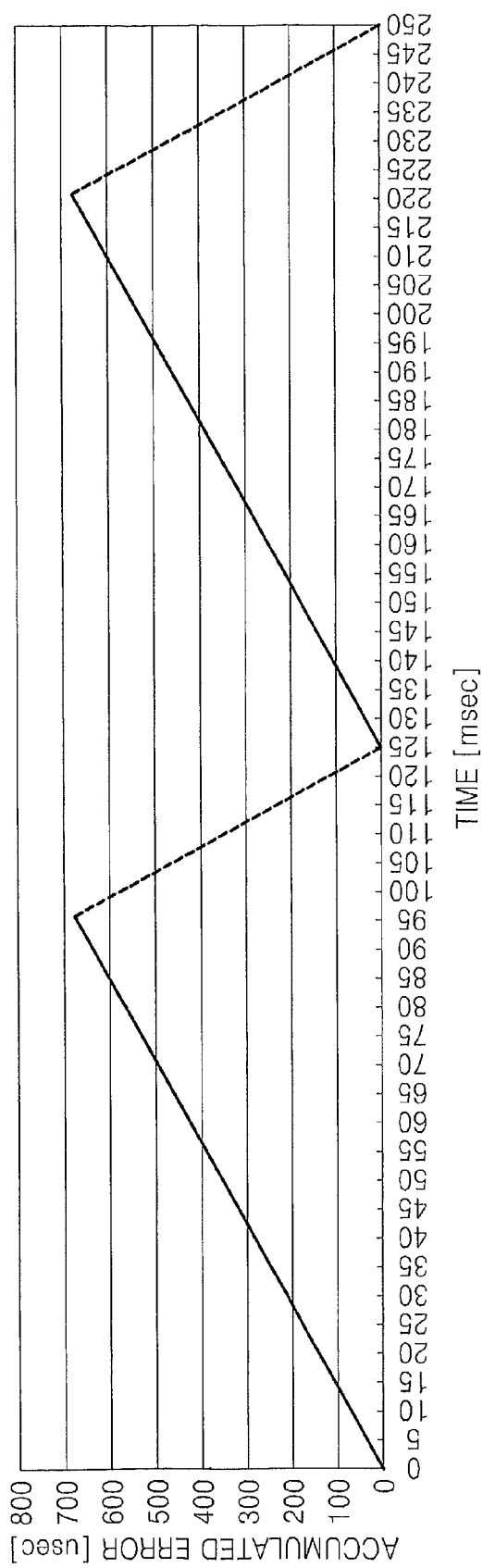
FIG. 4 is a graph showing the result of performing the method of compensating an error of a timer according to an exemplary embodiment of the present inventive concept.

FIG. 4 is a graph showing the result of performing the method of compensating an error of the timer 100 according to an exemplary embodiment of the present inventive concept. In FIG. 4, a portion indicated by a solid line is a section in which a tick is generated at the second cycle of 1007.080078125 μsec. In this section, the accumulated error of the timer 100 increases by 7.080075125 μsec for each 1 msec. Thus, the accumulated error of the timer 100 in the section where the tick is generated 96 times is a positive value of 679.6875 μsec with respect to 96 msec.

In FIG. 4, a portion indicated by a dotted line is a section in which a tick is generated at the first cycle of 976.5625 μsec. In this section, the accumulated error of the timer 100 increases by 23.4375 μsec for each 1 msec. Thus, the accumulated error of the timer 100 in the section where the tick is generated 29 times is a negative value of 679.6875 μsec with respect to 96 msec.

Referring to FIG. 4, the increase/decrease in the accumulated error of the timer 100 is repeated at a cycle of 125 msec and thus the accumulated error of the timer 100 has a value that is not greater than 679.6875 μsec. Therefore, the tick generated by the timer 100 according to the present exemplary embodiment may be used as a system tick of an operating system.

Figure 5:
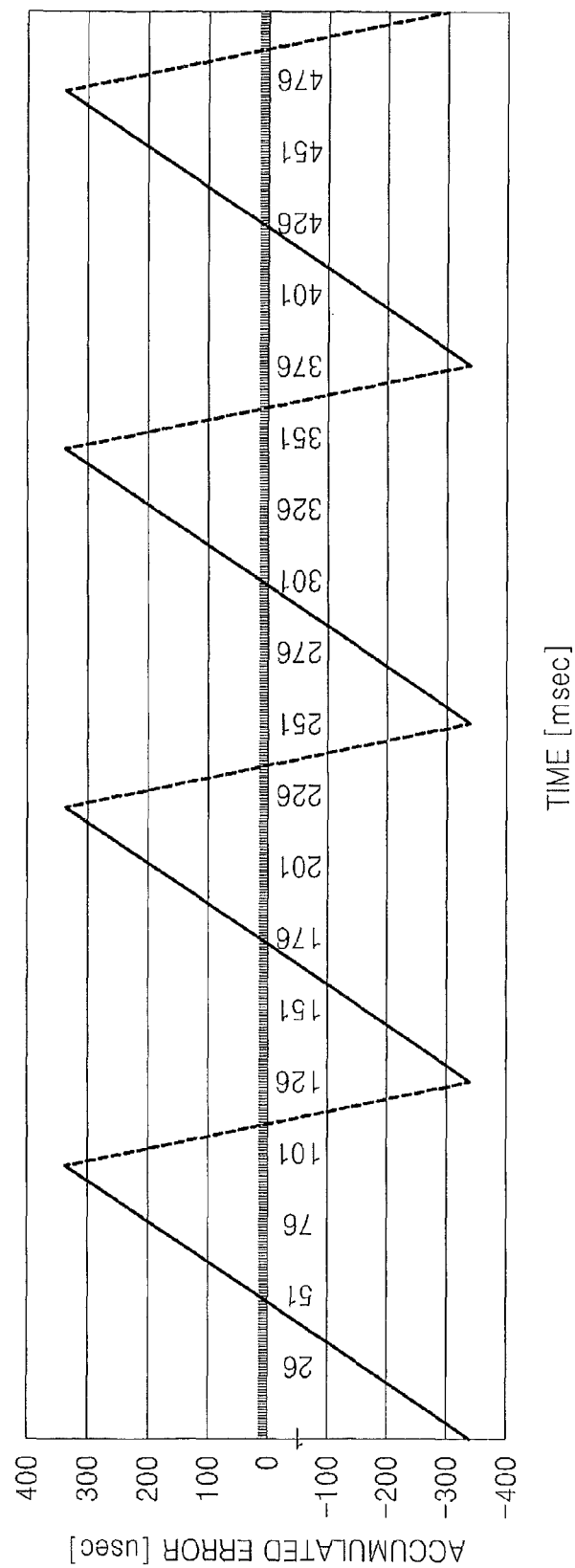
FIG. 5 is a graph showing the result of performing the method of compensating an error of a timer according to an exemplary embodiment of the present inventive concept, when an offset exists.

FIG. 5 is a graph showing the result of performing the method of compensating an error of the timer 100 according to an exemplary embodiment of the present inventive concept, when an offset exists. Referring to FIG. 5, when a certain offset value exists in the accumulated error of the timer 100, the range of the accumulated error of the timer 100 may be further reduced.

There may be another method of reducing a range of an accumulated error of the timer 100. For example, in FIG. 3, the tick counting value that is a determination standard of the comparator 142 is controlled to be 15 in the operation S24 and the tick counting value that is a determination standard of the comparator 142 is controlled to be 48 in the operation S34, thereby performing the operations S21-S35. Then, the tick counting value that is a determination standard of the comparator 142 is controlled to be 14 in the operation S24 and the tick counting value that is a determination standard of the comparator 142 is controlled to be 48 in the operation S34, thereby performing the operations S21-S35.

Table 3 shows the accumulated error of the timer 100 at the time when each of the tick counting operations according to the above-described method of compensating an accumulated error of the timer 100 is completed.

TABLE 3

| Order | Clock Signal Counting Number For Tick Generation | Tick Generation Number | Accumulated Error |
|---|---|---|---|
| 1 | 33 | 48 | 169.921875 μsec |
| 2 | 32 | 15 | −181.640625 μsec |
| 3 | 33 | 48 | 158.203125 μsec |
| 4 | 32 | 14 | −169.921875 μsec |

Referring to Table 3, according to the above-described method of compensating an accumulated error of the timer 100, it can be seen that the accumulated error of the timer 100 is further reduced from −181.640625 μsec to 169.921875 μsec, compared to the accumulated error according to the method illustrated in FIG. 3.

In the above, the method of compensating an error of the timer 100 according to the present exemplary embodiment is described assuming that the least common multiple of 976.5625 μsec and 1007.080078125 μsec that are the closest to 1 msec exists in the timer 100 that generates a tick at the target cycle of 1 msec by using the clock signal CLK of 32768 Hz. However, when the least common multiple of the two numbers that are the closest to 1 msec does not exist when using a clock signal, the method of compensating an error of the timer 100 according to the present exemplary embodiment may be implemented by using two numbers close to 1 msec having the least common multiple.

Figure 6:
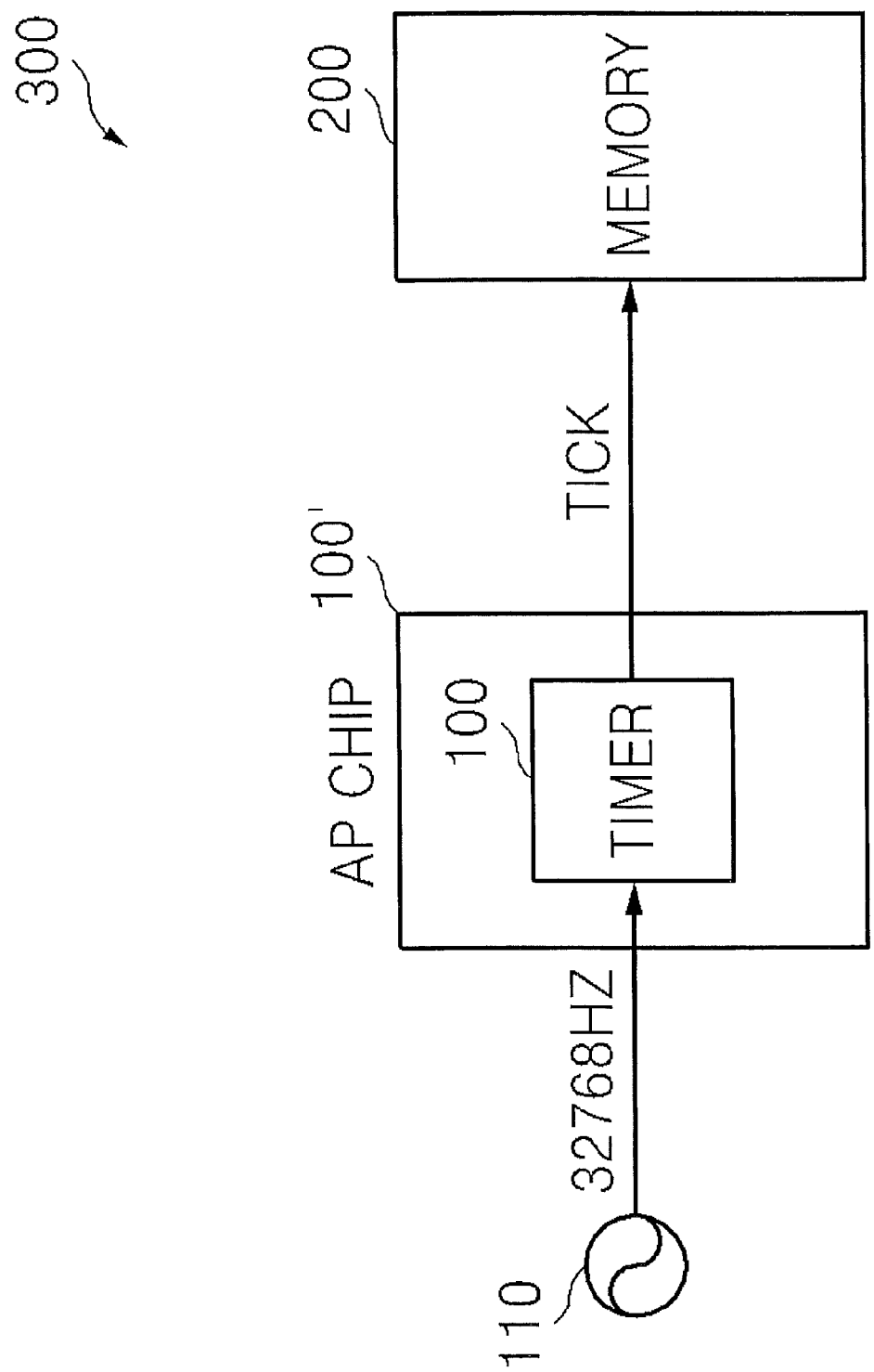
FIG. 6 is a block diagram of an electronic system according to an exemplary embodiment of the present inventive concept.

FIG. 6 is a block diagram of an electronic system 300 according to an exemplary embodiment of the present inventive concept. Referring to FIG. 6, the electronic system 300 includes an oscillator 110, an application chip (AP CHIP) 100', and a memory 200.

The application chip 100' includes the timer 100 generating a tick in response to the clock signal CLK received from the oscillator 110. The memory 200 may perform an operating system of the electronic system 300. The tick generated by the timer 100 included in the application chip 100' may be used as a system tick needed to operate the operating system.

Although, in FIG. 6, the timer 100 is included in the application chip 100', the present inventive concept is not limited thereto. Since the timer 100 is already described with reference to FIG. 1, a detailed description thereof will be omitted herein. Also, although, in FIG. 6, the electronic system 300 according to the present exemplary embodiment includes the memory 200 that uses the tick generated by the timer 100 as the system tick, the present inventive concept is not limited thereto.

Exemplary embodiment of the inventive concept can be embodied in hardware, software, firmware or combination thereof.

The method of compensation an error of the timer according to the inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable transmission medium can transmit carrier waves or signals (e.g., wired or wireless data transmission through the Internet). The computer-readable recording medium can also be distributed over network coupled computer systems so that the computer-readable code is stored and executed in a distributed fashion. Also, functional programs, codes, and code segments to accomplish the present inventive concept can be easily construed by programmers skilled in the art to which the present inventive concept pertains.

As described above, according to the method of compensating an error of a timer according to the present inventive concept, the accumulative error of a tick generated by using a clock signal having a predetermined frequency may be compensated at a particular cycle. Thus, the error generated according to the timer error compensation method according to the present inventive concept may be used as a system tick of an operating system.

While the inventive concept has been particularly shown and described with reference to exemplary embodiments thereof, it will be understood that various changes in form and details may be made therein without departing from the spirit and scope of the following claims.

What is claimed is:

1. A method of operating a timer, comprising:
generating a periodic timing signal having a first frequency that differs from a desired timer frequency by a first amount, by dividing a frequency of an input clock signal by N, where N is a positive integer greater than one;
switching a frequency of the periodic timing signal from the first frequency to a second frequency that differs from the desired timer frequency by a second amount, by dividing the frequency of the input clock signal by M in response to counting a first number of cycles of the periodic timing signal having the first frequency, where M is a positive integer unequal to N and where M−N equals ±K, wherein K is a positive integer; and
switching the frequency of the periodic timing signal from the second frequency to the first frequency in response to counting a second number of cycles of the periodic timing signal having the second frequency, where the second number is unequal to the first number;
wherein a first error value equals an absolute value of a difference between an accumulated duration of the first number of cycles and a duration of a target cycle and a second error value equals an absolute value of a difference between an accumulated duration of the second number of cycles and the duration of the target cycle;
wherein the first number and the second number are determined by the first error value and the second error value;
wherein the first number is equivalent to a ratio of a least common multiple of the first error value and the second error value, to the first error value; and
wherein the second number is equivalent to a ratio of the least common multiple of the first error value and the second error value to the second error value.

2. The method of claim 1, wherein said switching the frequency of the periodic timing signal from the first frequency to the second frequency and said switching the frequency of the periodic timing signal from the second frequency to the first frequency are performed in an alternating back-and-forth sequence so that the frequency of the periodic timing signal is repeatedly switched between the first and second frequencies.

3. The method of claim 2, wherein a ratio of the first number of cycles to the second number of cycles is maintained at a level sufficient to maintain a zero average error between the frequency of the periodic timing signal and the desired timer frequency.

4. The method of claim 1, wherein a ratio of the first number of cycles to the second number of cycles is maintained at a level sufficient to maintain a zero average error between the frequency of the periodic timing signal and the desired timer frequency.

5. A method of compensating an error of a timer, the method comprising:
- generating a tick at a first cycle that is shorter than a target cycle by counting a clock signal i times, or generating a tick at a second cycle that is longer than the target cycle by counting the clock signal j times, wherein i and j are natural numbers equal to or greater than 2;
- counting the tick generated at the first cycle m times or counting the tick generated at the second cycle n times, wherein m and n are natural numbers equal to or greater than 2, and outputting a result of counting of the tick generated at the first cycle and the tick generated at the second cycle; and
- controlling a reference value that is a base for tick generation and a reference value that is a base for the tick counting result;
- wherein a first absolute error value is an absolute value of a difference between the target cycle and the first cycle and a second absolute error value is an absolute value of a difference between the target cycle and the second cycle;
- wherein the numbers m and n are determined by the first absolute error value and the second absolute error value; and
- wherein the number m is a value obtained by dividing a least common multiple of the first absolute error value and the second absolute error value by the first absolute error value, and the number n is a value obtained by dividing the least common multiple of the first absolute error value and the second absolute error value by the second absolute error value.

6. The method of claim 5, wherein the generating of a tick comprises:
- counting the clock signal; and
- generating a tick at the first cycle based on a result of comparison between a clock signal counting number and a reference value i, or generating a tick at the second cycle based on a result of comparison between the clock signal counting number and a reference value j.

7. The method of claim 6, wherein the outputting of a result of counting of the tick comprises:
- counting the tick generated at the first cycle or counting the tick generated at the second cycle; and
- outputting a result of comparison between a reference value and each of the counting number of the ticks generated at the first cycle and the counting number of the ticks generated at the second cycle.

8. The method of claim 7, wherein the controlling of a reference value that is a base for tick generation and a reference value that is a base for the tick counting result comprises:
- controlling the reference value that is a base for the tick generation and the reference value that is a base for the tick counting result, based on a result of comparison between the reference m and the counting number of the ticks generated at the first cycle; and
- controlling the reference value that is a base for the tick generation and the reference value that is a base for the tick counting result, based on a result of comparison between the reference n and the counting number of the ticks generated at the second cycle.

9. The method of claim 7, wherein the controlling of a reference value that is a base for tick generation and a reference value that is a base for the tick counting result comprises:
- dividing the reference value m into a plurality of first sub-units, and controlling the reference value that is a base for the tick generation and the reference value that is a base for the tick counting result, based on a result of comparison between each of the plurality of first sub-units and the counting number of the ticks generated at the first cycle; and
- dividing the reference value n into at least one second sub-unit, and controlling the reference value that is a base for the tick generation and the reference value that is a base for the tick counting result, based on a result of comparison between the at least one second sub-unit and the counting number of the ticks generated at the second cycle.

10. The method of claim 7, wherein the controlling of a reference value that is a base for tick generation and a reference value that is a base for the tick counting result comprises:
- dividing the reference value m into at least one first sub-unit, and controlling the reference value that is a base for the tick generation and the reference value that is a base for the tick counting result, based on a result of comparison between each of the at least one first sub-unit and the counting number of the ticks generated at the first cycle; and
- dividing the reference value n into a plurality of second sub-units, and controlling a reference value that is a base for the tick generation and a reference value that is a base for the tick counting result, based on a result of comparison between each of the plurality of second sub-units and the counting number of the ticks generated at the second cycle.

11. The method of claim 7, further comprising resetting the clock signal counting value or a tick counting value based on a result of comparison between the reference value and a counting result of the ticks generated at the first cycle and a result of comparison between the reference value and a counting result of the ticks generated at the second cycle.

12. A method of compensating an error of a timer, the method comprising:
- generating a tick at first cycle that is shorter than a target cycle by counting a clock signal i times, or generating a tick at a second cycle that is longer than the target cycle by counting the clock signal j times, wherein i and j are predetermined natural numbers equal to or greater than 2;
- counting the tick generated at the first cycle m times or counting the tick generated at the second cycle n times, wherein m and n are predetermined natural numbers equal to or greater than 2, and outputting a result of counting the tick generated at the first cycle and the tick generated at the second cycle; and
- controlling a reference value that is a base for tick generation and a reference value that is a base for the tick counting result,
- wherein the number m is a value obtained by dividing a least common multiple of a first absolute error value and a second absolute error value by the first absolute error value, and the number n is a value obtained by dividing the least common multiple of the first absolute error value and the second absolute error value by the second absolute error value, and
- wherein the first absolute error value is an absolute value of a difference between the target cycle and the first cycle and the second absolute error value is an absolute value of a difference between the target cycle and the second cycle.

13. The method of claim 12, wherein the generating of a tick comprises:
- counting the clock signal; and
- generating a tick at the first cycle based on a result of comparison between the clock signal counting number and a reference value i, or generating a tick at the second cycle based on a result of comparison between the clock signal counting number and a reference value j.

14. The method of claim 13, wherein the outputting of a result of counting the tick comprises:
   counting the tick generated at the first cycle or counting the tick generated at the second cycle; and
   outputting a result of comparison between a reference value and each of the counting number of the ticks generated at the first cycle and the counting number of the ticks generated at the second cycle.

15. The method of claim 14, wherein the controlling of a reference value that is a base for tick generation and a reference value that is a base for the tick counting result comprises:
   controlling the reference value that is a base for the tick generation and the reference value that is a base for the tick counting result, based on a result of comparison between the reference m and the counting number of the ticks generated at the first cycle; and
   controlling the reference value that is a base for the tick generation and the reference value that is a base for the tick counting result, based on a result of comparison between the reference n and the counting number of the ticks generated at the second cycle.

16. The method of claim 14, wherein the controlling of a reference value that is a base for tick generation and a reference value that is a base for the tick counting result comprises:
   dividing the reference value m into a plurality of first sub-units, and controlling the reference value that is a base for the tick generation and the reference value that is a base for the tick counting result, based on a result of comparison between each of the plurality of first sub-units and the counting number of the ticks generated at the first cycle; and
   dividing the reference value n into at least one second sub-unit, and controlling the reference value that is a base for the tick generation and the reference value that is a base for the tick counting result, based on a result of comparison between the at least one second sub-unit and the counting number of the ticks generated at the second cycle.

17. The method of claim 14, wherein the controlling of a reference value that is a base for tick generation and a reference value that is a base for the tick counting result comprises:
   dividing the reference value m into at least one first sub-unit, and controlling the reference value that is a base for the tick generation and the reference value that is a base for the tick counting result, based on a result of comparison between each of the at least one first sub-unit and the counting number of the ticks generated at the first cycle; and
   dividing the reference value n into a plurality of second sub-units, and controlling a reference value that is a base for the tick generation and a reference value that is a base for the tick counting result, based on a result of comparison between each of the plurality of second sub-units and the counting number of the ticks generated at the second cycle.

18. The method of claim 14, further comprising resetting the clock signal counting value or a tick counting value based on a result of comparison between the reference value and a counting result of the ticks generated at the first cycle and a result of comparison between the reference value and a counting result of the ticks generated at the second cycle.

* * * * *